(12) United States Patent
Kato

(10) Patent No.: US 7,911,799 B2
(45) Date of Patent: Mar. 22, 2011

(54) UNIT FOR ACCOMMODATING ELECTRONIC COMPONENT

(75) Inventor: Koichi Kato, Toyoake (JP)

(73) Assignee: Denso Corporation, Kariya (JP)

( * ) Notice: Subject to any disclaimer, the term of this patent is extended or adjusted under 35 U.S.C. 154(b) by 754 days.

(21) Appl. No.: 11/982,775

(22) Filed: Nov. 5, 2007

(65) Prior Publication Data

US 2008/0106858 A1    May 8, 2008

(30) Foreign Application Priority Data

Nov. 6, 2006    (JP) ................. 2006-300760

(51) Int. Cl.
    *H05K 7/00*    (2006.01)
(52) U.S. Cl. ........ 361/729; 361/680; 361/780; 361/711; 361/760
(58) Field of Classification Search .............. 361/729, 361/680, 760, 687, 711
    See application file for complete search history.

(56) References Cited

U.S. PATENT DOCUMENTS

| | | | |
|---|---|---|---|
| 7,428,140 B2 * | 9/2008 | Yokote .............. | 361/679.09 |
| 2006/0097643 A1 * | 5/2006 | Kato et al. .............. | 315/56 |
| 2006/0113874 A1 * | 6/2006 | Shen .............. | 310/340 |

FOREIGN PATENT DOCUMENTS

| JP | 10-051158 | 2/1998 |
|---|---|---|
| JP | 2006-050814 | 2/2006 |

OTHER PUBLICATIONS

Office Action dated Oct. 19, 2010 in corresponding Japanese patent application No. 2006-300760 with English translation.

* cited by examiner

*Primary Examiner* — Ishwarbhai B Patel
*Assistant Examiner* — Andargie M Aychillhum
(74) *Attorney, Agent, or Firm* — Harness, Dickey & Pierce, PLC

(57) ABSTRACT

The present invention provides an electronic control unit which is capable of suppressing harmful effects caused by liquid while suppressing increase in the size thereof. The electronic control unit includes an electronic component in which a circuit element coated with an anti-splash agent is implemented, a casing, and a liquid discharge portion. The casing includes a base on which the electronic component is mounted, a cover which is connected to the base in the state where the electronic component is covered with the cover, and a connector which electrically connects the electronic component to the outside. The liquid discharge portion includes a flow passage in which liquid which has intruded into an internal space in the casing formed by the base, the cover and the connector for housing the electronic component flows, and an opening portion which discharges the liquid to the outside of the internal space via the flow passage.

8 Claims, 3 Drawing Sheets

(GROUND SIDE)

UNIT FOR ACCOMMODATING ELECTRONIC COMPONENT

CROSS-REFERENCE TO RELATED APPLICATION

This application is related to Japanese Patent Application NO. 2006-300760 filed on Nov. 6, 2006, the contents of which are hereby incorporated by reference.

BACKGROUND OF THE INVENTION

1. Technical Field of the Invention

The present invention relates to a unit for accommodating electronic components and in particular, to such a unit which is capable of suppressing harmful effects caused by liquid such as steam, rain drops which might have intruded into the inside thereof.

2. Description of the Related Art

As one conventional electronic-component accommodating unit, Japanese Patent Application Laid-Open Publication NO. 10-51158 discloses as an electronic control unit for enhancing waterproof property.

The electronic control unit as disclosed in this Japanese Patent Application Laid-Open Publication is a case consisting of a box and a cover which houses a circuit board on which electronic components are implemented. A rib which protrudes from the edge section of the cover toward the inner face side of the box when the opening portion of the box is covered with the cover is integrally provided, and resin is filled inside the box so that the resin is in contact with the rib. Doing this prevents liquid from intruding into the electronic components and the circuit board which are housed in the case, even if a gap is generated at a joint between the cover and the box and liquid has intruded inside therethrough. This is because the rib of the cover is in contact with the resin in the box at a portion just inside of the gap. However, although the electronic control unit disclosed in Japanese Patent Application Laid-Open Publication NO. 10-51158 enables the prevention of liquid from intruding into the electronic components and the circuit board, there is a need for providing a rib in the cover, thereby causing a disadvantage that the size of the electronic control unit increases.

SUMMARY OF THE INVENTION

The present invention has been accomplished in view of the foregoing problem, and it is an object of the present invention to provide an electronic component accommodating unit which is capable of enabling suppression of harmful effects caused by liquid such as steam, and/or rain drops while suppressing any increase in size thereof.

To accomplish the foregoing object, an electronic-component accommodating unit according to the present invention includes: an electronic component in which a circuit element coated with an anti-splash agent is implemented; a casing that includes a base on which the electronic component is mounted, a cover that covers the base, and a connector that electrically connects the electronic component to the outside; and a liquid discharge portion that includes a flow passage in which liquid which has intruded into an internal space in the casing formed by the base, the cover and the connector for housing the electronic component, and an opening portion which discharges the liquid to the outside of the internal space via the flow passage.

In such electronic-component accommodating unit, although liquid may intrude into the internal space, for example, through the gap or the like between the base and the cover, the circuit element is coated with an anti-splash agent and thus mere liquid intrusion is less likely to cause harmful effects. However, if the liquid remains in the internal space, in particular, on the anti-splash agent, the liquid may cause harmful effects on the electronic component.

However, according to the present invention, even if liquid has intruded into the internal space, the liquid discharge portion enables discharging liquid to the outside of the internal space, thereby enabling suppressing liquid from remaining in the internal space. Accordingly, there is no need for providing a rib in the cover or the base to prevent liquid intrusion, thereby enabling suppression of harmful effects caused by liquid while suppressing any increase in the size of the electronic-component accommodating unit.

DESCRIPTION OF THE PREFERRED EMBODIMENT

Embodiments of the present invention will now be described with reference to drawings.

A electronic control unit according to the present embodiment will be described. This embodiment exemplifies an electronic control unit employed in a lighting ON/OFF control unit for an electric discharge lamp. In addition, the electronic control unit is preferably employed in the lighting ON/OFF control unit for a headlamp of a vehicle or the like. The electronic control unit of this embodiment corresponding to the electronic-component accommodating unit of the present invention.

Figure 4:
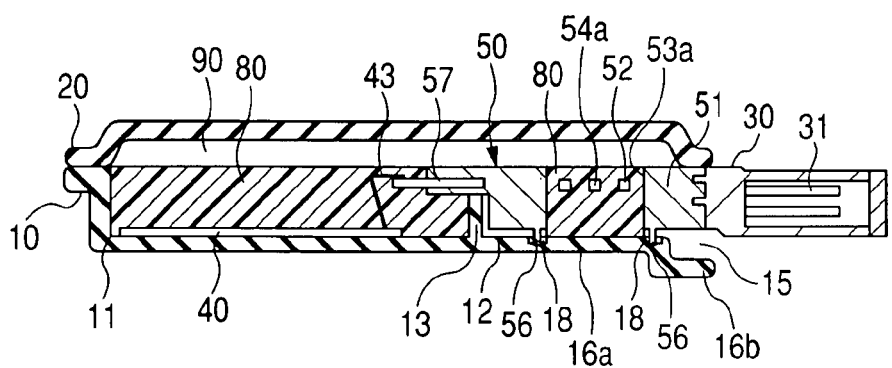
FIG. 4 is a sectional view cut along IV-IV in FIG. 3.

As shown in FIG. 4 or the like, the lighting ON/OFF control unit is a so called ballast which controls lighting ON/OFF of the electric discharge lamp (hereinafter, also referred to as a ballast), in which electronic components, that is, a first electronic component 40 and a second electronic component 50 are housed in an internal space 90 of a casing including a base 10, the cover 20, and a connector 30.

Figure 1:
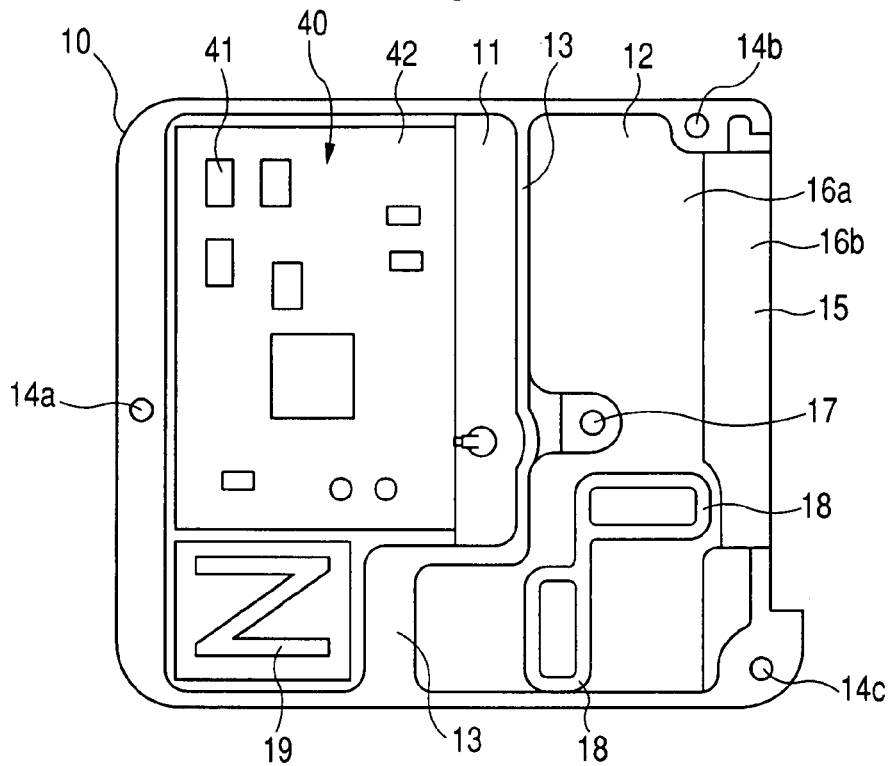
FIG. 1 is a plan view showing a schematic structure of an electronic control unit (lighting ON/OFF control unit) according to an embodiment of the present invention in the state where a first electronic component is mounted thereon.

The base 10 is made of a metallic material, and is a box-shaped member which has been divided by a wall section 13 into a first chamber 11 and a second chamber 12 as shown in FIG. 1 or the like. The base 10 has a rectangular-shaped bottom face 16*a*, a step section 16*b* which is formed on one side of the bottom face 16*a* and which is more concave than the bottom face 16*a*, a continuous side wall on the three sides of the bottom face 16*a*, and an opening portion 15 formed on the single side on which the step section 16*b* is formed. The opening portion 15 is made of a gap between the base 10 and the connector 30 which is communicated with a flow passage including a gap between the base 10 and the second electronic component 50 (first and second flow passages), to be described later, which is made of a gap between the base 10 and the second electronic component 50, and the opening portion 15 constitutes a part of a liquid discharge portion 60.

In addition, a flange is formed around the base 10 and threaded holes 14a to 14c for connecting the cover 20 with bolts are formed at three locations in the flange. The portion at which the base 10 and the cover 20 are in contact with each other is a flat plane on which no rib or the like is formed. Accordingly, the base 10 and the cover 20 are fixed to each other merely with bolts.

The first electronic component 40 is mounted in the first chamber 11 of the base 10 via an adhesive or the like as shown in FIG. 1 or the like. In addition, a transformer 70 which is electrically connected to the first electronic component 40 by a terminal 71 is implemented in the first chamber 11 (although the transformer 70 is not implemented in FIG. 1). The transformer 70 includes a protrusion section on a face of the base 10 which is opposed to the bottom face 16a (not shown). In addition, as shown in FIG. 1, a concave section 19 which has a shape which corresponds to the protrusion section formed on the transformer 70 is formed on the bottom face 16a of the first chamber 11. Subsequently, the transformer 70 is mounted in the state where the protrusion section has been inserted into the concave section 19 of the first chamber 11 via an adhesive or the like.

Figure 3:
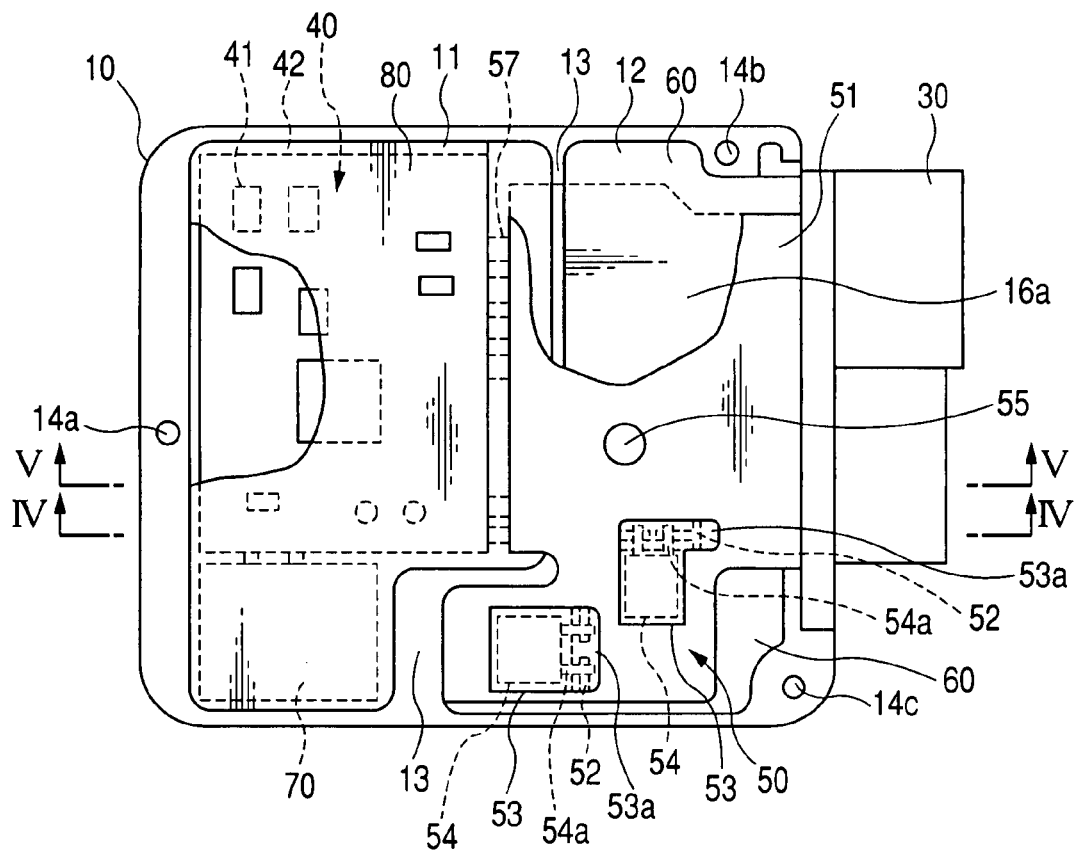
FIG. 3 is a plan view showing a schematic structure of the electronic control unit (lighting ON/OFF control unit) according to the embodiment of the present invention in the state where an anti-splash agent is filled therein.
Figure 5:
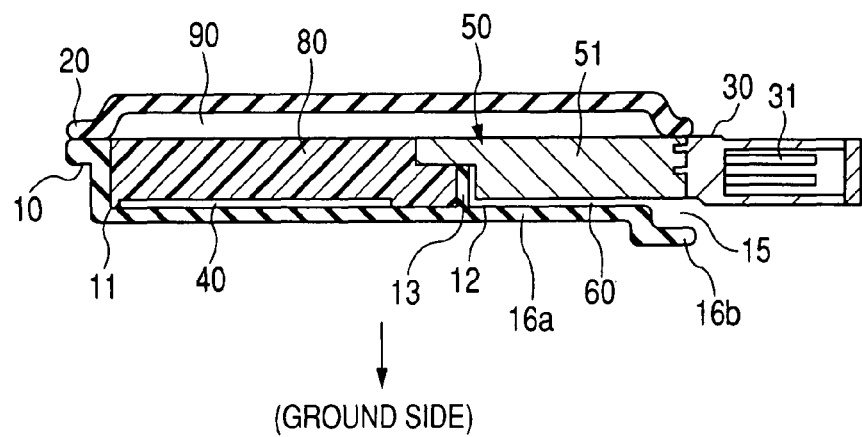
FIG. 5 is a sectional view cut along V-V in FIG. 3.
Figure 6:
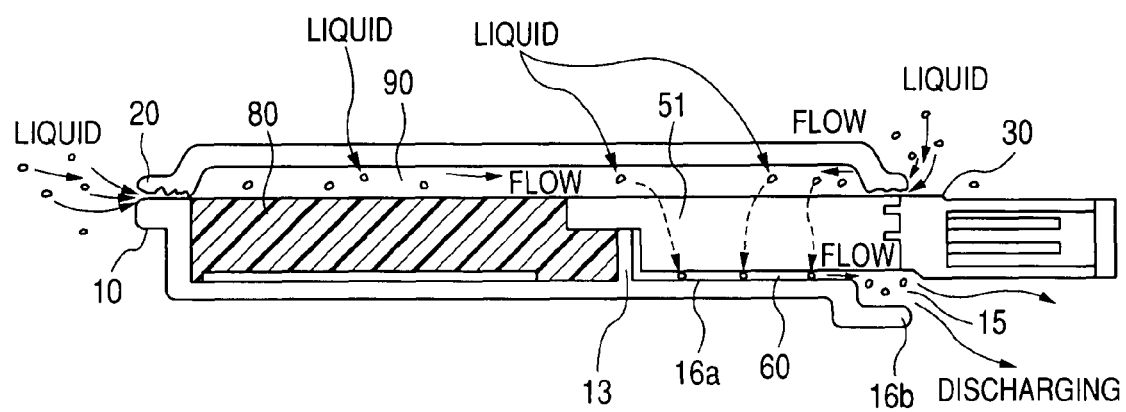
FIG. 6 is also a sectional view cut along V-V in FIG. 3 and showing a flow passage for discharging liquid.

Subsequently, as shown in FIG. 3 to FIG. 5, the first chamber 11 is filled with the anti-splash agent 80 in the state where the first electronic component 40 and the transformer 70 are mounted therein. The anti-splash agent 80 may be filled to the extent where the first chamber 11 is completely filled, that is, to the extent where the anti-splash agent 80 is substantially flush with the flange of the base 10 as shown in FIG. 4 or the like. As a result of this, the first electronic component 40 and the transformer 70 are coated with the anti-splash agent 80. The anti-splash agent 80 is not particularly limited, as long as it is made of waterproof resin such as silicone.

The first electronic component 40 which is mounted in the first chamber 11 is not particularly limited, but it is, for example, a control circuit board in which a plurality of circuit elements 41 such as transistors and resistance are implemented on a print circuit board 42 made of, for example, a ceramic substrate, a resin substrate, and which actually executes a lighting ON/OFF control of the electric discharge lamp. In addition, the circuit elements 41 which are implemented on the print circuit board 42 are circuit elements of a relatively smaller size compared to circuit elements 54, to be described later, which are mounted on the second electronic component 50.

Figure 2:
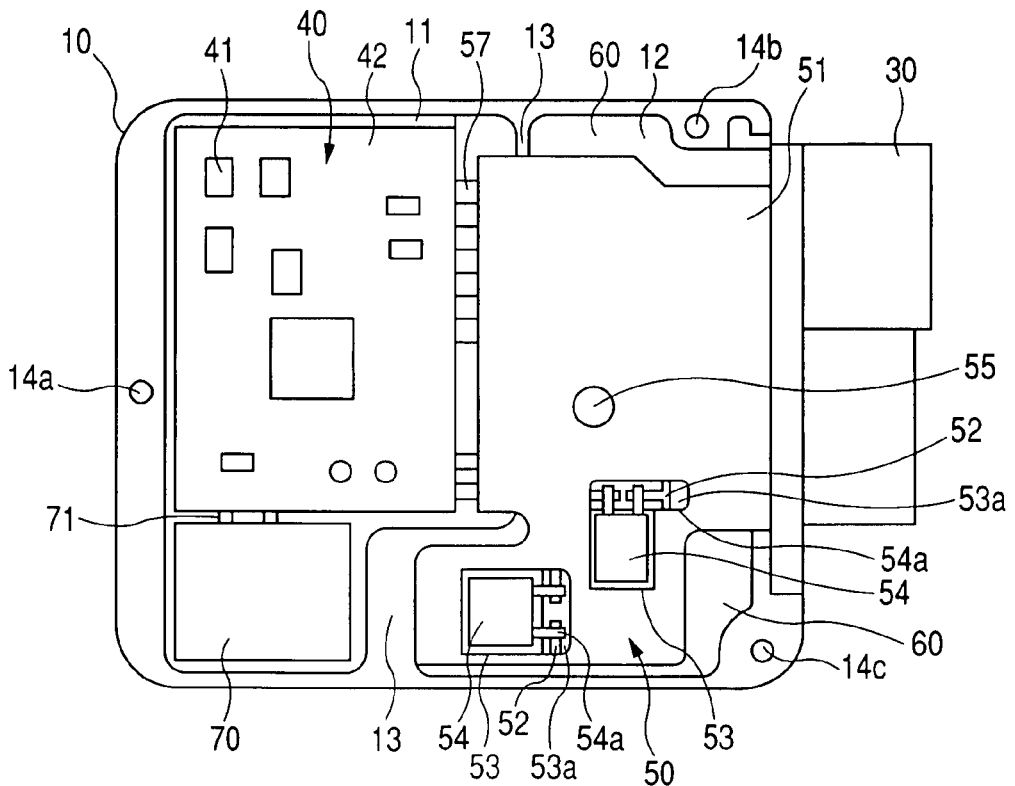
FIG. 2 is a plan view showing a schematic structure of the electronic control unit (lighting ON/OFF control unit) according to the embodiment of the present invention in the state where a second electronic component is mounted thereon.

On the other hand, as shown in FIG. 2 or the like, the second electronic component 50 is mounted in the second chamber 12 of the base 10 via an adhesive or the like, having a gap (a second gap) from the side wall of the base 10 which serves as the liquid discharge portion 60. More specifically, the bottom face 16a of the second chamber 12 includes an annular concave section 18. The annular concave section 18 has a shape which corresponds to an annular protrusion section 56, to be described later, which is formed on the face of the second electronic component 50 opposed to the base 10. In addition, the annular concave section 18 is formed shallower than the thickness of the annular protrusion section 56.

Subsequently, the second electronic component 50 is mounted in the state where the annular protrusion section 56 has been inserted into the annular concave section 18 via an adhesive or the like. In addition, a threaded hole 17 for securing the second electronic component 50 to the base 10 is formed in the second chamber 12. The second electronic component 50 is secured to the base 10 by inserting a bolt through a connecting section 55 and then screwing the bolt into the threaded hole 17. The first electronic component 40 and the second electronic component 50 are electrically connected to each other via a lead wire 43 and a terminal 57 as shown in FIG. 4 or the like.

Since the annular concave section 18 is shallower compared to the thickness of the annular protrusion section 56 as described above, mounting of the second electronic component 50 on the base 10 (the second chamber 12) in the state where the annular protrusion section 56 has been inserted into the annular concave section 18 enables forming a gap (a first flow passage) between the bottom face of the second electronic component 50 which serves as the liquid discharge portion 60 and the bottom face 16a of the base 10 as shown in FIG. 4 and FIG. 5. In this way, the liquid discharge portion 60 according to the present embodiment is formed by communicating the opening portion 15 made of a gap between the base 10 and the connector 30, the flow passage made of the gap between the base 10 and the electronic component, that is, the second flow passage made of a gap between the side wall of the second electronic component 50 and the side wall of the base 10, and the first flow passage made of a gap between the bottom face of the second electronic component 50 and the bottom face 16a of the base 10. Doing this makes it easy to provide the liquid discharge portion 60 with ease merely by providing gaps at least a part of the way between the second electronic component 50 and the base 10, and between the connector 30 and the base 10.

The second electronic component 50 which is mounted in the second chamber 12 is an input protection circuit in which the circuit elements 54 such as a coil, a capacitor and the like are implemented on a concave section 53 of a bus bar in which the terminals 52, 57 are built in a plastic material 51. As shown in FIG. 3 or the like, the circuit elements 54 are implemented on the concave section 53, and the anti-splash agent 80 is filled in the concave section 53 in the state where the terminal 54a of the circuit elements 54 and the terminal 52 of the bus bar are electrically connected to each other. The anti-splash agent 80 is the same as the anti-splash agent 80 as described above, and it is preferable that the anti-splash agent 80 is filled to the extent where it covers the circuit elements 54, the terminal 54a and the terminal 52. Doing this is preferable since doing this enables providing the anti-splash agent 80 only at necessary portions.

In addition, a placement section which corresponds to a shape of the circuit elements 54 is formed in a part of the concave section 53 which is provided in the plastic material 51. At the same time, a through hole 53a is formed in another part, more specifically, in a portion which corresponds to a connecting section for electrically connecting the terminal 54a of the circuit elements 54 to the terminal 52 of the bus bar. Therefore it makes electric connection between the terminal 52 of the bus bar and the terminal 54a of the circuit elements 54 implemented in the concave section 53 easier. That is, this enables resistance welding between the terminal 52 of the bus bar and the terminal 54a of the circuit elements 54a implemented in the concave section 53 through use of the through hole 53a.

In addition, the annular protrusion section 56 as described above is formed around the through hole 53a in the face of the bus bar which is opposed to the base 10. As shown in FIG. 4, doing this forms a space closed by the annular protrusion section 56 and the annular concave section 18 when filling the anti-splash agent 80 in the concave section 53, thereby enables suppressing the anti-splash agent 80 from flowing into the flow passage (the first flow passage) of the liquid discharge portion 60.

In addition, in order to be electrically connected with the outside, the second electronic component 50 is electrically connected to the connector 30 which is connected to at least one of the base 10 or the cover 20. Specifically, according to the present embodiment, the plastic material 51 of the second electronic component 50 and a housing of the connector 30 are mechanically connected with each other, and the terminal 52 of the second electronic component 50 and a terminal 31 of the connector 30 are electrically connected to each other. The lighting ON/OFF control unit includes an attachment section (not shown) to an attached body (i.e.; an object to which the casing attached) on at least one of the base 10 or the cover 20, and is attached to the attached body so that the liquid discharge portion 60 is closer to the ground. Specifically, as shown in FIG. 4 and FIG. 5, the lighting ON/OFF control unit is attached to the attached body so that the base 10 is closer to the ground, and the cover 20 is closer to the opposite side (the sky). Doing this makes it easy to discharge liquid which has intruded into the internal space 90 to the outside of the internal space through the liquid discharge portion 60.

In such lighting ON/OFF control unit, since the base 10 and the cover 20 are only secured to each other with a bolt, liquid may intrude into the internal space 90 through the gap between the base 10 and the cover 20 or the like. However, since the circuit elements 41, 54 are coated with the anti-splash agent, mere liquid intrusion is less likely to cause harmful effects. However, if the liquid remains in the internal space 90, in particular, on the anti-splash agent 80, liquid intrusion may cause harmful effects on the circuit elements 41, 54 (the first electronic component 40 and the second electronic component 50).

In the present embodiment, however, even if liquid has intruded into the internal space 90 of the casing, the liquid discharge portion 60 enables discharging liquid to the outside of the internal space 90, and thus enabling suppressing liquid from remaining in the internal space 90. In other words, liquid which has intruded through the gap between the base 10 and the cover 20 flows from the surface of the anti-splash agent 80 which has been filled in the first chamber 11 to the surface of the second electronic component 50 or the like, thereby flowing from the surface of the second electronic component 50 into the flow passage of the liquid discharge portion 60 and thus reaching the opening portion 15, through which liquid is more likely to be discharged. Accordingly, there is no need for providing a rib on the base 10 and the cover 20 to prevent intrusion of liquid, and thus it is possible to suppress harmful effects caused by liquid while suppressing increase in the size of the lighting ON/OFF control unit.

In the embodiment of the present embodiment, description has been given using an example in which the electronic control unit of the present invention is employed in the lighting ON/OFF control unit of an electric discharge lamp. However, the present invention is not limited to this. The purpose of the present invention can be achieved by any electronic control unit of the present invention, as long as it includes an electronic component in which a circuit element coated with an anti-splash agent is implemented, a base on which the electronic component is mounted, a cover which is connected to the base, a connector which electrically connects an electronic component to the outside and which is connected to at least one of the base or the cover, and a liquid discharge portion which discharges liquid which has intruded into an internal space formed by the base, the cover and the connector for housing an electronic component to the outside of the internal space.

Furthermore, in the present embodiment of the present invention, description has been given using an example in which the first electronic component 40 and the second electronic component 50 are electrically connected to each other as an electronic component. However, the present invention is not limited to this. For example, the purpose of the present invention can be achieved when there is a single electronic component. In addition, the purpose of the present invention can also be achieved when there are three electronic components.

Furthermore, in the present embodiment, description has been given on the liquid discharge portion of the present invention using an example in which the liquid discharge portion is formed by communicating the opening portion 15 made of the gap between the base 10 and the connector 30, the second flow passage made of the gap between the side wall of the second electronic component 50 and the side wall of the base 10, and the first flow passage made of the gap between the bottom face of the second electronic component 50 and the bottom face 16a of the base 10. However, the present invention is not limited to this. The purpose of the present invention can be achieved by any liquid discharge portion, as long as it includes a flow passage in which liquid which has intruded into an internal space formed by the base, the cover and the connector for housing electronic component, and the opening portion which discharges the liquid via the flow passage to the outside of the internal space 90.

Furthermore, in the present embodiment of the present invention, description has been given on the base using an example in which the base has been divided by the wall section into the first chamber and the second chamber. The present invention is not limited to this.

Furthermore, in the present embodiment, description has been given using an example in which the annular protrusion section 56 is provided on the face of the second electronic component 50 which is opposed to the base 10, and the annular concave section 18 is provided on the bottom face 16a of the base 10. However, the present invention is not limited to this. The annular protrusion section 56 may be provided on the face of the second electronic component 50 which is opposed to the base 10, and the bottom face 16a of the base 10 may be made flat. Alternatively, the face of the second electronic component 50 which is opposed to the base 10 may be made flat, and the annular protrusion section may be provided on the bottom face 16a of the base 10. Doing this also enables providing the gap between the bottom face of the second electronic component 50 and the bottom face 16a of the base 10.

Providing the annular protrusion section 56 on the face of the second electronic component 50 which is opposed to the base 10 and providing the annular concave section 18 on the bottom face 16a of the base 10, as used in the present invention, enables the annular protrusion section 56 to be inserted into the annular concave section 18 when mounting the second electronic component 50 on the base 10. Therefore, the present embodiment is preferable since it suppresses the base 10 and the second electronic component 50 from being offset.

Other Embodiment

In the electronic control unit according to the present invention, the casing may be attached to the attached body so that the base side is closer to the ground than the cover side, the opening portion may be formed closer to the base side, and the flow passage is communicated with the opening portion and is made of a gap which is formed at least a part of the way between the electronic component and the casing.

In such a case, the base may be formed of a box-shaped member having the side face and the bottom face. The connector may be provided on the side closer to the side face of the base. The opening portion may be made of the gap which is formed between the base and the connector. In addition, the flow passage may be communicated with the opening portion and may be made of the gap which is formed between the electronic component and the base.

Furthermore, the flow passage may include the first flow passage which is made of the gap which is formed between the electronic component and the bottom face of the base, and the second flow passage which is made of the gap which is formed between the electronic component and the side face of the base. The opening portion may be communicated with the first flow passage and the second flow passage, and the opening position thereof closer to the ground direction may be the bottom face position of the base.

Doing this enables providing the liquid discharge portion with ease merely, for example, by forming the gap which serves as the flow passage between the electronic components and the base, and forming the gap which serves as the opening portion between the connector and the base.

In addition, an electronic component may include the first electronic component in which a circuit element is implemented on the print circuit board, and the second electronic component which is electrically connected to the first electronic component and in which a circuit element is implemented in the concave section of the bus bar.

As described above, the present invention may also be employed to an electronic component which has been divided into the first electronic component in which a circuit element is implemented on the print circuit board and the second electronic component which is electrically connected to the first electronic component and in which the circuit element is implemented in the concave section of the bus bar.

Furthermore, the base may be divided into the first chamber and the second chamber by the wall section. The first chamber may be equipped with the first electronic component and may be filled with the anti-splash agent so that the first electronic component is covered with the anti-splash agent. The second chamber may be equipped with the second electronic component, and the concave section of the second electronic component may be filled with the anti-splash agent. Thus, it is preferable that it enables providing an anti-splash agent only at necessary portions.

In addition, the concave section may include a through hole at a position which corresponds to a position at which the terminal which is built in the bus bar and the terminal of the circuit element which is implemented in the concave section of the bus bar are electrically connected to each other.

Doing this makes it easier to electrically connect the terminal which is built in the bus bar and the terminal of the circuit element which is implemented in the concave section with each other. In other words, doing this enables resistance welding of the terminal which is built in the bus bar and the terminal of the circuit element which is implemented in the concave section through the use of the through hole.

In addition, the second electronic component which includes the annular protrusion section around the through hole on the face of the bus bar which is opposed to the base, in which the base includes the annular protrusion section which is shallower compared to the thickness of the annular concave section, may be mounted on the base in the state where the annular protrusion section has been inserted into the annular concave section.

Thus, it enables forming a first gap between the base and the second electronic component. Furthermore, doing this enables suppressing the anti-splash agent from flowing into the first gap and thereby suppressing the anti-splash agent from clogging the first gap, when filling an anti-splash agent in the concave section.

Furthermore, the electronic components are suitable to be employed in the lighting ON/OFF control circuit of an electric discharge lamp.

Furthermore, the electronic components may be employed in an electric discharge lamp system which includes an electronic control unit which is used as the lighting ON/OFF control unit as described above and an electric discharge lamp of which lighting ON/OFF is controlled by the electronic control unit.

What is claimed is:

1. A unit accommodating an electronic component, the unit comprising:
    a casing that includes a base on which the electronic component is mounted, a cover that covers the base, and a connector electrically connected to the electronic component, the base, the cover and the connector forming an internal space within the casing, the internal space accommodating the electronic component therein; and
    a liquid discharge portion that includes, i) a flow passage allowing liquid in the internal space to flow, and ii) an opening portion formed to communicate with the flow passage and to discharge, outside the unit, the liquid that comes through the flow passage; wherein
    the electronic component is coated with an anti-splash agent and includes a first electronic component in which a circuit element is implemented on a printed circuit board and a second electronic component which is electrically connected to the first electronic component and in which a circuit element is implemented in a concave section of a bus bar, and
    the concave section includes a through hole at a position which corresponds to a position at which a terminal which is built in the bus bar and a terminal of the circuit element which is implemented in the concave section of the bus bar are electrically connected to each other.

2. The unit according to claim 1, wherein
    the casing is attached to an object so that a side of the base is closer to ground than a side of the cover, the opening portion is formed closer to the side of the base, and
    the flow passage communicates with the opening portion and is made of a gap which is formed between the electronic component and the casing.

3. The unit according to claim 2, wherein
    the base is formed of a box-shaped member having a side face and a bottom face,
    the connector is provided on the side of the base closer to the side face of the base,
    the opening portion is made of a gap which is formed between the base and the connector, and
    the flow passage communicates with the opening portion and is made of a gap which is formed between the electronic component and the base.

4. The unit according to claim 3, wherein
    the flow passage has a first flow passage which is made of a gap which is formed between the electronic component and the bottom face of the base, and a second flow passage which is made of a gap which is formed between the electronic component and the side face of the base, and the opening portion communicates with the first flow passage and the second flow passage, and an opening position of the opening portion closer to the ground is a bottom face position of the base.

5. The unit according to claim 1, wherein the base is divided by a wall section into a first chamber and a second chamber, the first chamber is equipped with the first electronic component and is filled with the anti-splash agent so that the first electronic component is covered with the anti-splash agent, and the second chamber is equipped with the second electronic component, and the concave section of the second electronic component is filled with the anti-splash agent.

6. The unit according to claim 1, wherein the second electronic component includes an annular protrusion section around the thorough hole in a face of the bus bar which is opposed to the base, the base includes an annular concave section which is shallower compared to a thickness of the annular protrusion section, and the second electronic component is mounted on the base in the state where the annular protrusion section has been inserted into the annular concave section.

7. The unit according to claim 1, wherein, the electronic component is a lighting ON/OFF control circuit of an electric discharge lamp.

8. An electric discharge lamp system comprising:

a unit accommodating an electronic component, the unit comprising:

a casing that includes a base on which the electronic component is mounted, a cover that covers the base, and a connector electrically connected to the electronic component, the base, the cover and the connector forming an internal space within the casing, the internal space accommodating the electronic component therein; and a liquid discharge portion that includes, i) a flow passage allowing liquid in the internal space to flow, and ii) an opening portion formed to communicate with the flow passage and to discharge, outside the unit, the liquid that comes through the flow passage; wherein the electronic component is coated with an anti-splash agent and includes a first electronic component in which a circuit element is implemented on a printed circuit board and a second electronic component which is electrically connected to the first electronic component and in which a circuit element is implemented in a concave section of a bus bar, and the concave section includes a through hole at a position which corresponds to a position at which a terminal which is built in the bus bar and a terminal of the circuit element which is implemented in the concave section of the bus bar are electrically connected to each other;

the electronic component is a lighting ON/OFF control circuit of an electric discharge lamp, and the electric discharge lamp lighting ON/OFF is controlled by the unit.

* * * * *